United States Patent

[11] 3,569,872

[72] Inventor Irving Berlin
Dallas, Tex.
[21] Appl. No. 820,687
[22] Filed Nov. 27, 1968
[45] Patented Mar. 9, 1971
[73] Assignee Vitramon, Incorporated
Monroe, Conn.
Continuation-in-part of application Ser. No. 665,944, Sept. 1, 1967, abandoned.

[54] ELECTRONIC COMPONENT
6 Claims, 5 Drawing Figs.

[52] U.S. Cl. 333/70, 323/74, 317/242, 317/101
[51] Int. Cl. H03h 7/06
[50] Field of Search 333/70, 70 (R); 323/74; 317/242

[56] References Cited
UNITED STATES PATENTS

| | | | |
|---|---|---|---|
| 2,637,777 | 5/1953 | Kilby et al. | 333/70R |
| 2,940,035 | 6/1960 | Lefrowitz | 323/74 |
| 2,566,666 | 9/1951 | Khouri | 323/74 |
| 3,217,276 | 11/1965 | Cooper | 333/81 |
| 3,402,372 | 9/1968 | Wasyluk | 333/70R |
| 3,217,209 | 11/1965 | Kinsella et al. | 317/101 |
| 3,235,939 | 2/1966 | Rodriguez et al. | 29/625 |
| 3,456,215 | 7/1969 | Denes | 333/79 |

*Primary Examiner*—Herman Karl Saalbach
*Assistant Examiner*—C. Baraff
*Attorney*—Arnold Grant

ABSTRACT: A distributed RC component wherein alternate layers of a resistive material and a conductive material are separated by and embedded within a dielectric material. The result is a monolithic body having both resistive and capacitive capabilities and which functions as a filter circuit, a second embodiment has one of the capacitive and resistive layers embedded on a surface of the dielectric.

INVENTOR
Irving Berlin
BY
[signature]
ATTORNEY

Patented March 9, 1971 3,569,872

2 Sheets-Sheet 2

INVENTORS.
Irving Berlin
Gilbert Goodman
BY
ATTORNEY.

ELECTRONIC COMPONENT

This application is a continuation-in-part of an earlier copending application, Ser. No. 665,944, filed Sept. 1, 1967, now abandoned.

The present invention relates to an electric circuit component of the solid state, monolithic type which is capable of functioning electrically as a network of line connected discreet components to serve as a wide band, band-stop filter. More particularly, the present invention is directed to a component in which there is a sharp frequency cutoff characteristic represented in graph form by a steeply sloping attenuation curve plotted as decibel decline corresponding to frequency rise, a wide band of attenuation and a sloping curve of decreasing attenuation.

It is an object of the present invention to attain this electrical performance in a discreet solid state component incorporating in monolithic form a plurality of conductive and resistive layers and an intermediate dielectric substrate for separating each of two spaced-apart capacitive electrodes from a common capacitive electrode.

It is a further object of the present invention to face the common electrode layer with an additional layer of resistance having a separate terminal so that the component may be connected in a circuit of parameters.

It is a still further object of the present invention to provide a novel electronic component in which the resistive function is distributed throughout the body of the component and functions also as conductive material to form capacitance or inductive function in the component.

The invention can be successfully embodied in a solid state component constructed in accordance with the following description having reference to the appended drawings wherein.

Figure 1:
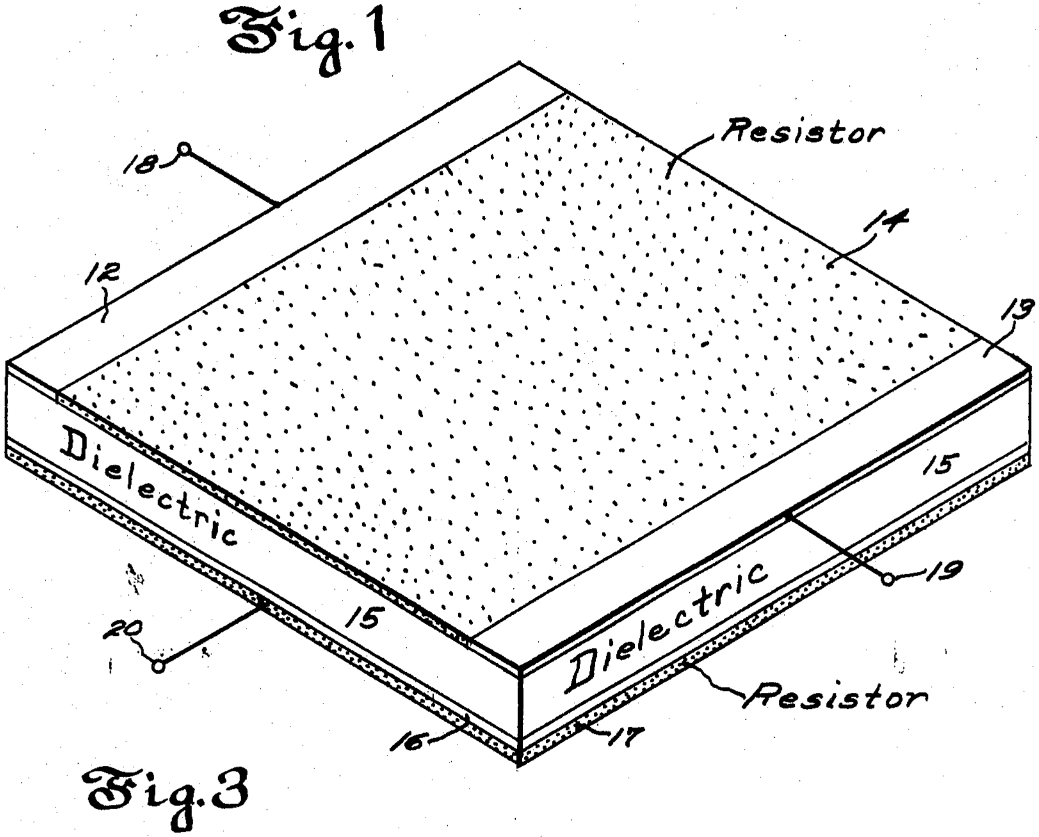
FIG. 1 is an isometric view drawn on a considerably enlarged scale showing a circuit component in monolithic form incorporating the improvements.

Referring now to the drawings, there is shown a monolithic component having two spaced-apart capacitive electrodes 12, 13 bridged by a layer of resistive material 14. The electrodes 12, 13 and the resistive layer 14 are, in turn, superimposed on a dielectric substrate 15, a capacitive electrode layer 16 and a base layer of resistive material 17. This arrangement results in the equivalent of two capacitors formed by the spaced electrodes 12, 13, the common electrode layer 16 and the intermediate dielectric substrate 15; a pair of resistors formed by resistive layers 14 and 17; and, a distributed capacitor formed by resistive layer 14, dielectric substrate 15 and electrode layer 16. The network resulting from this unique arrangement is diagrammatically depicted in FIG. 2.

Figure 3:
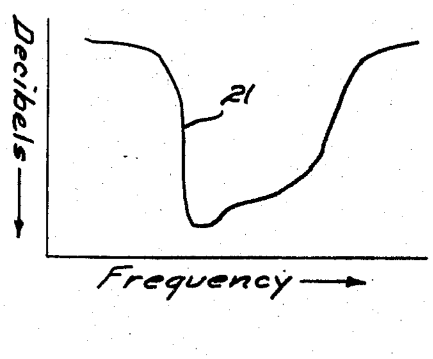
FIG. 3 is a graph showing the characteristic performance of the improved component plotted in terms of decibel decline corresponding to frequency rise.

Electrodes 12, 13 are provided with terminal connections 18, 19 and resistor 17 is provided with a separate terminal 20. These terminals afford a variety of ways of incorporating the filter in electronic circuits to serve, among other purposes, as a wide band, band-stop filter whose performance characteristics are exemplified by the attenuation curve of FIG. 3, wherein decibel decrease is plotted against frequency increase.

While the specific materials chosen as the aforesaid layers of the component are subject to variation, successful performance has resulted from the use of elements having the following specifications as to size and properties:

Dielectric substrate 15 may be of the usual insulative materials used in monolithic components such as a suitable ceramic. The electrodes 12 and 13 may be of silver or any other suitable conductor in the order of .0001 inch to .002 inch thick. The resistor 14 may be rated at 20,000 ohms per square mil of the same thickness as electrodes 12 and 13 which are conductively connected thereby. The electrode layer 16 and the underlying outboard resistive facing 17 may each be in the order of .0001 inch to .002 inch thick. The number of network forming layers of the improved component may be increased to raise the electrical rating and the core of the component comprising the simple layers shown in FIG. 1 may be encapsulated in a suitably tough insulative jacket (not shown) to isolate the component from adjacent structures. The terminals 18, 19 and 20 will extend through and project out from such jacket for the connection of leads for incorporating the component in electronic circuits as is well understood in the art. A suitable miniature size for the entire component is .125 inch by .125 inch by .010 inch thick.

Figure 4:
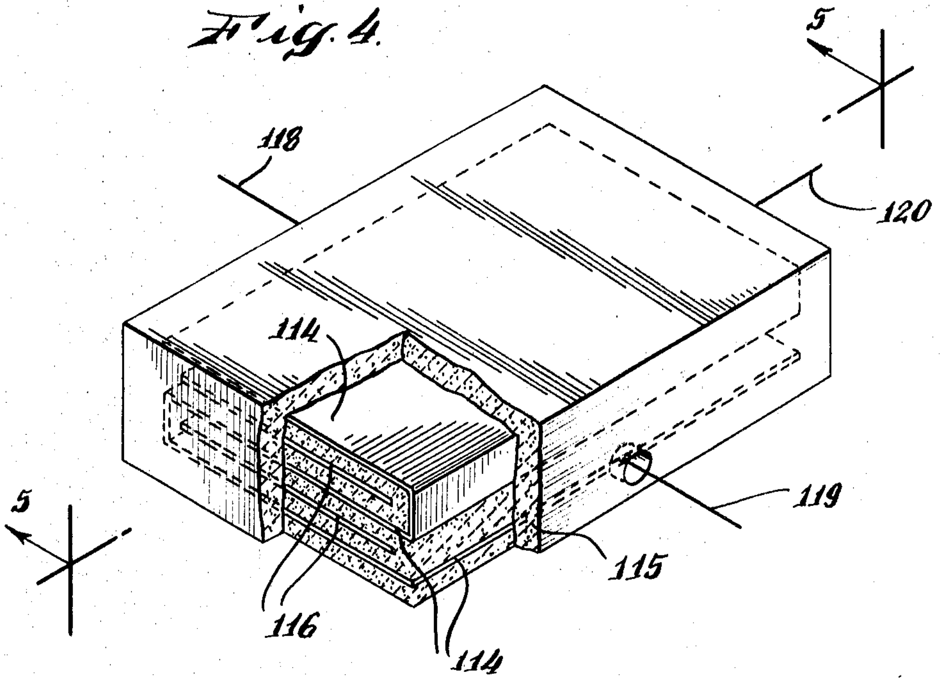
FIG. 4 is a perspective view partly broken away and in section showing a novel electronic component having a resistive segment distributed throughout the fused or sintered structure.

Turning now to FIG. 4 there is an electronic component in which parts similar to those in FIG. 1 have the same number preceded by 1. Thus, part 114 corresponds to part 14 in FIG. 1. In the embodiment of the invention shown in FIG. 4, the resistive material 114 is shown forming plates of the capacitor structure opposite the substantially parallel plates 116. In this manner, the resistive material 114 functions as a conductive material for the purposes of the capacitive function and as resistive material for the resistant function. The resistor material 114 may be formed from a noble metal and a glass or ceramic material combination. This combination of resistive material must have a similar fusing or sintering characteristic to that of the dielectric material.

Figure 2:
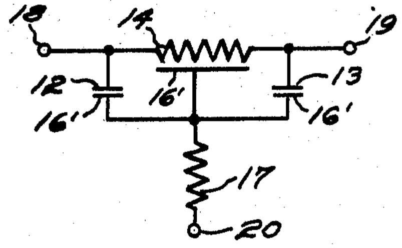
FIG. 2 is a symbolic diagram of a network of line-connected discreet components whose combined electrical function is simulated by the solid state component of FIG. 1.
Figure 5:
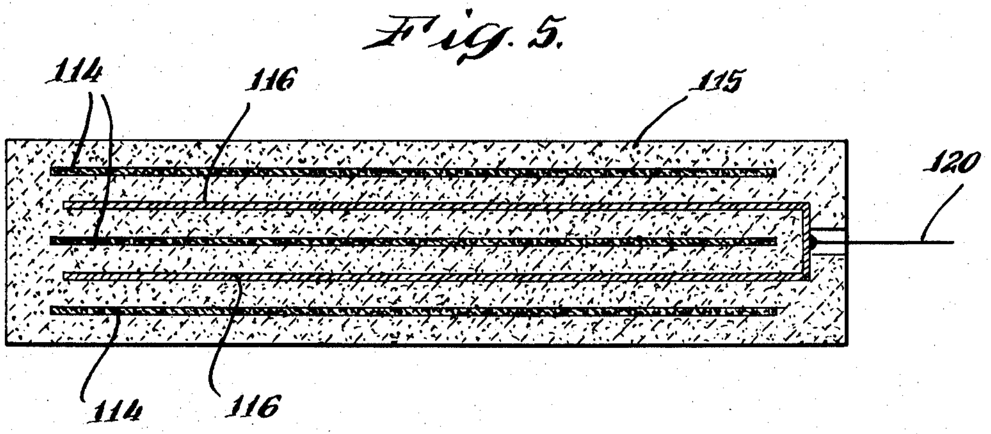
FIG. 5 is a sectional view of the novel electronic component shown in FIG. 4 taken in the plane 55 as indicated in the FIG. 4.

As best shown in FIG. 5, the conductive plates 116 are connected together to an external electrode numeral 120. A lead 119 is connected to one portion of the resistive material 114 for connection to the external circuit. An additional lead 118 is also provided which connects to the resistive material 114 to form the notch filter as shown in FIG. 2. The electrode connections may be made to other portions of the resistant material depending on the function desired. It is noteworthy that the resistive material 114 has a relatively long path length thereby permitting extremely careful variation in the amount of resistance which it is desired for the component to have. This long path length is very useful for adjusting the RC product of the component if it be a capacitive resistive component.

The above physical specifications are subject to considerable variation for varying the rating of the component as a whole wherefore the appended claims apply to and are intended to embrace all variations making use of the novel principles of construction defined in the claims.

I claim:

1. A multielement electronic component comprising a parallelpiped monolithic body having parallel upper and lower major surfaces, at least one layer of resistive material having at least a portion thereof embedded in the monolithic body and lying in a plane substantially parallel to the upper and lower surfaces of the monolithic body, at least one layer of a conductive material lying in a plane substantially parallel to the upper and lower surfaces of the monolithic body, a layer of dielectric material intermediate said at least one layer of conductive material and having an area substantially conforming to the area of the major surfaces of the monolithic body and said at least one layer of resistive material, the layers of resistive material immediately adjacent the layers of dielectric material functioning as resistors and capacitor plates, and at least three terminal connections to interconnect the component to external circuitry.

2. A multielement electronic component as defined in claim 1 wherein at least one of the major surfaces of the monolithic body is substantially covered with a layer of a resistive material.

3. A multielement electronic component as defined in (either) claim 1 (or claim 2) wherein at least one of the major surfaces of the monolithic body has at least two spaced-apart conductive layers fused thereon.

4. A multielement electronic component as defined in claim 3 wherein the spaced-apart conductive layers are electrically joined together by a layer of resistive material fused onto the surface of the monolithic body between the spaced conductive layers.

5. A multielement electronic component as defined in claim 2 wherein a layer of conductive material is immediately adjacent and substantially parallel to the layer of resistive material which covers at least one major surface of the monolithic body.

6. A multielement electronic component as defined in claim 1 wherein the layers of conductive material are wholly embedded in the monolithic body and are electrically joined by a conductive connector which is also wholly embedded in the monolithic body and lies in a plane substantially perpendicular to the plane of the conductive layers.